US005420798A

United States Patent [19]

Lin et al.

[11] Patent Number: 5,420,798

[45] Date of Patent: May 30, 1995

[54] SUPPLY VOLTAGE DETECTION CIRCUIT

[75] Inventors: Tien-Ler Lin, Cupertino; Tom D. Yiu, Milpitas, both of Calif.

[73] Assignee: Macronix International Co., Ltd., Hsinchu, Taiwan, Prov. of China

[21] Appl. No.: 129,864

[22] Filed: Sep. 30, 1993

[51] Int. Cl.[6] .......... G11C 16/02

[52] U.S. Cl. .......... 364/483; 365/189.09; 365/226

[58] Field of Search .......... 364/483; 365/189.09, 365/226

[56] References Cited

U.S. PATENT DOCUMENTS

| | | | |
|---|---|---|---|
| 4,321,489 | 3/1982 | Higuchi et al. | 307/362 |
| 4,441,172 | 4/1984 | Ebel | 365/226 |
| 4,473,759 | 9/1984 | Mahabadi | 307/350 |
| 4,534,018 | 8/1985 | Eckert et al. | 364/464.02 X |
| 4,613,770 | 9/1986 | Raab | 307/350 |
| 4,631,707 | 12/1986 | Watanabe | 365/226 |
| 4,812,680 | 3/1989 | Kawashima et al. | 307/350 |
| 4,975,883 | 12/1990 | Baker et al. | 365/226 |
| 5,003,196 | 3/1991 | Kawaguchi | 307/290 |
| 5,172,342 | 12/1992 | Gochi | 365/226 |
| 5,180,926 | 1/1993 | Skripek | 307/272.3 |
| 5,208,488 | 5/1993 | Takiba et al. | 307/362 |
| 5,243,233 | 9/1993 | Cliff | 307/296.4 |
| 5,276,646 | 1/1994 | Kim et al. | 365/189.09 |
| 5,280,198 | 1/1994 | Almulla | 307/296.6 |
| 5,329,491 | 7/1994 | Brown et al. | 365/226 |
| 5,331,599 | 7/1994 | Yero | 365/189.09 X |
| 5,351,212 | 9/1994 | Hashimoto et al. | 365/189.09 |

*Primary Examiner*—Edward R. Cosimano
*Attorney, Agent, or Firm*—Haynes & Davis

[57] ABSTRACT

A voltage detection circuit for preventing the erasing and programming of a nonvolatile memory device during power up and power down sequences. A power source is coupled to the high voltage input and the low voltage input to provide a reference voltage in response to the greater of the high voltage input or the low voltage input. A low voltage detector is coupled to the low voltage input and the reference voltage and has circuitry to provide a first not-ready signal when the voltage on the low voltage input falls below a predetermined low voltage threshold. A high voltage detector is coupled to the high voltage input, the reference voltage, and the output of the low voltage detector and has circuitry to provide a second not-ready signal when either the first not-ready signal is received or the voltage on the high voltage input falls below a predetermined high voltage threshold. The not-ready signals prevent erasing or programming operations to occur in the nonvolatile memory device.

39 Claims, 10 Drawing Sheets

(From U.S. Patent No. 4,975,883)

SUPPLY VOLTAGE DETECTION CIRCUIT

BACKGROUND OF THE INVENTION 1. Field Of The Invention

The present invention relates to circuits for monitoring power supply voltage levels in the field of nonvolatile memory devices.

2. Description Of Related Art

Flash EPROMs are a growing class of nonvolatile storage integrated circuits. These flash EPROMs have the capability of electrically erasing, programming or reading a memory cell in the chip. The entire array can be simultaneously erased electrically. The flash EPROM can also be randomly read or written.

The cells themselves use only a single device per cell and are formed using so-called floating gate transistors in which the data is stored in a cell by charging or discharging the floating gate. The floating gate is a conductive material, typically made of polysilicon, which are insulated from the channel of the transistor by a thin layer of oxide or other insulating material, and insulated from the control gate wordline of the transistor by a second layer of insulating material.

The act of charging the floating gate is termed the "program" step for a flash EPROM. This is accomplished through a so-called hot electron injection by establishing a large positive voltage between the gate and source, as much as 12 volts, and a positive voltage between the drain and source, for instance, 6 volts.

The act of discharging the floating gate is called the "erase" function for a flash EPROM. This erasure function is typically carried out by a Fowler-Nordheim (F-N) tunneling mechanism between the floating gate and the source of the transistor (source erase) or between the floating gate and the substrate (channel erase). For instance, a source erase operation is induced by establishing a large positive voltage from the source to gate, while floating the drain of the respective memory cell. This positive voltage may be as much as 12 volts.

Given that flash EPROMs can be programmed or erased by applying voltage to the device, systems incorporating flash EPROMs often design capabilities to program and erase the flash EPROMs. In order for a system to provide capabilities to program and erase the flash EPROMs, the system has to provide not only a Vcc voltage but also a Vpp voltage. Vcc is generally a 5 volt supply for controlling the logic in the read mode of the nonvolatile memory device. Vpp is a 12 volt supply used in combination with Vcc for controlling the programming and erasing modes of the nonvolatile memory device.

A problem arises when the computer system which uses nonvolatile memory as part of its storage elements goes through a power up or power down sequence. A power up sequence refers to the moment a user starts the computer system, while a power down sequence refers to the moment a user turns off the computer system. During these power up and power down sequences, the system power supplies for Vcc and Vpp rise and fall through their proper operating ranges. When this occurs, control signals within the system are not guaranteed to be valid. These invalid signals can cause inadvertent programming or erasing of the nonvolatile data. In certain instances, permanent damage to the nonvolatile memory can occur.

Protection circuits have been designed to prevent the application of Vcc voltage or Vpp voltage to the nonvolatile device when the voltages are below the proper operating level. One such system is disclosed in Baker, et al., U.S. Pat. No. 4,975,883, issued Dec. 4, 1990. Baker, et al. uses two comparators to detect the proper voltage level. One for the Vcc voltage and one for the Vpp voltage. The comparators constantly dissipate a substantial amount of DC power. Further, many of the devices in the voltage detector of Baker, et al. are exposed to the high Vpp voltage. Devices subjected to the high voltage of Vpp require additional protection to reduce the stress on such components. Also, to reduce power dissipation, longer channel devices are needed which take significant space on the chip. Accordingly, disadvantages of Baker, et al. include comparators that dissipate DC power, requirement that circuits provide for high voltage protection, and the overall complexity of the detection circuit.

Therefore, it is desirable to design a voltage protection circuit that improves and overcomes the disadvantages of the prior art.

SUMMARY OF THE INVENTION

The present invention provides a circuit to detect when a voltage is above or below a predetermined voltage level. According to the present invention, a voltage detection circuit comprises a high voltage input to receive a high supply voltage and a low voltage input to receive a low supply voltage. A reference circuit is coupled to the high voltage input and the low voltage input and provides a reference voltage in response to the high voltage input or the low voltage input. A low voltage detector is coupled to the low voltage input and the reference voltage and has circuitry to provide a first not-ready signal when a voltage on the low voltage input falls below a predetermined low voltage threshold. A high voltage detector is coupled to the high voltage input, the reference voltage, and the output of the low voltage detector and has circuitry to provide a second not-ready signal when either the first not-ready signal is received or a voltage on the high voltage input falls below a predetermined high voltage threshold.

In order to avoid subjecting devices of the voltage detection circuit to the high voltage input, the reference circuit, according to one aspect of the invention, includes circuitry coupled to the high voltage input having an output node to reduce the high supply voltage to a node voltage for the output node and a circuit that supplies the reference voltage as a function of the greater of the node voltage or the low supply voltage. Using this technique, the high voltage input is reduced to a level similar to the low voltage input.

The low voltage detector, according to another aspect of the invention, includes a threshold inverter having a trip voltage set to the predetermined low voltage threshold. The threshold inverter includes a transistor device having a channel with a length and a width to set the trip voltage for the threshold inverter of the low voltage detector. The low voltage detector includes circuitry coupled to the low voltage input to provide a voltage to the threshold inverter. The low voltage detector includes a hysteresis circuit, coupled to the threshold inverter, to provide a first predetermined voltage threshold when the low voltage input exceeds the first voltage threshold and a second predetermined voltage threshold when the low voltage input falls below the second voltage threshold. The low voltage detector includes an output buffer, coupled to the hysteresis circuit, to provide the first not-ready signal.

The high voltage detector includes a threshold inverter having a trip voltage set to the predetermined high voltage threshold. The threshold inverter of the high voltage detector includes a transistor device having a channel with a length and a width to set the trip voltage for the threshold inverter of the high voltage detector. The high voltage detector includes threshold logic, coupled to the threshold inverter and the first not-ready signal, to provide a threshold signal in response to the threshold inverter and the first not-ready signal. The high voltage detector includes an output buffer responsive to the threshold signal to provide the second not-ready signal.

The invention can also be characterized as a voltage detector comprising a reference circuit having a first voltage on a first input and a second voltage on a second input and circuitry to reduce the second voltage to a node voltage and to supply a reference voltage in response to the greater of the first voltage or the node voltage. A first voltage detection circuit is powered by the reference voltage and is responsive to the first voltage to provide a first signal when the first voltage is below the first predetermined voltage. A second voltage detection circuit is powered by the reference voltage and is responsive to the second voltage to provide a second signal when the second voltage is below the second predetermined voltage and when the first signal is asserted.

The circuitry of the reference circuit implements a voltage divider to reduce the second voltage to the node voltage. MOS devices are used to implement the voltage divider. The second voltage detection circuit, according to another aspect of the invention, has a first input, coupled to the first signal of the first voltage detection circuit, and a second input, coupled to the second voltage, and is responsive to the first signal and the second voltage to provide the second signal.

The first voltage detection circuit includes a threshold detector set at the first predetermined voltage to provide the first signal when the first voltage is below the first predetermined voltage. The first voltage detection circuit includes a hysteresis circuit, coupled to the threshold detector, to provide the first signal at a third predetermined voltage when the first voltage falls below the third predetermined voltage.

The second voltage detection includes a diode device, coupled to the second voltage, to reduce the second voltage to a third voltage. A control circuit, coupled to the third voltage and the reference voltage, provides an input voltage when the third voltage is greater than the reference voltage. A threshold circuit having a threshold voltage set at the second predetermined voltage is responsive to the input voltage to provides a threshold signal. The second voltage detection circuit includes a voltage converter, coupled to the threshold detector, responsive to the threshold voltage to provide the second signal. Since both the first voltage and the second voltage have to exceed their predetermined minimum voltages before the second signal is provided, the second signal can be used to enable erasing and programming operations of the flash EPROM. The voltages are at proper operating levels to insure proper operation of the flash EPROM circuits.

Flash EPROMs are used in many applications. The invention can be characterized as a processing system comprising a power supply generating a first output for programming supply voltage and a second output for read supply voltage. A reference supply, coupled to the first output and the second output, provides a reference voltage in response to the greater of the programming supply voltage or the read supply voltage. A first voltage detector is powered by the reference voltage and is responsive to the read supply voltage to provide a first signal when the read supply voltage falls below a first predetermined voltage threshold. A second voltage detector is powered by the reference voltage and is responsive to the programming supply voltage and the first signal to provide a second signal when either the programming supply voltage falls below a second predetermined voltage threshold or when the first signal is provided. A memory, coupled to the power supply, the first voltage detector, and the second voltage detector, stores data and program instructions and is responsive to the first or second signals to control access of the memory. A processing unit, coupled to the power supply and to the memory, accesses data and program instructions in the memory to process the data and program instructions.

According to another aspect of the invention, the reference supply includes a voltage reduction circuit, coupled to the programming voltage of the power supply, which provides an intermediate voltage in response to the programming voltage. The reference supply provides the reference voltage in response to the greater of the intermediate voltage or the read voltage. The second voltage detector has an input to receive the first signal and is responsive to the first signal to provide the second signal.

According to another aspect of the invention, the memory includes a nonvolatile memory that can be erased and programmed when the programming voltage is provided to the memory. The nonvolatile memory can be placed into a read only mode in response to the first signal. The second signal of the second voltage detector disables erase and programming functions to the memory.

The present invention is particularly suited for control circuits in a nonvolatile memory device that is programmable by the application of programming voltage. The invention will prevent inadvertent erasure or programming of the nonvolatile device during power up or power down sequences when control signals are unstable or in a unknown state. Thus, the use of the preferred embodiment of the present invention affords greater protection against accidental erasure and programming of the nonvolatile memory devices.

Other aspects and advantages of the present invention can be seen upon review of the figures, the detailed description and the claims which follow.

BRIEF DESCRIPTION THE DRAWINGS

Figure 5:
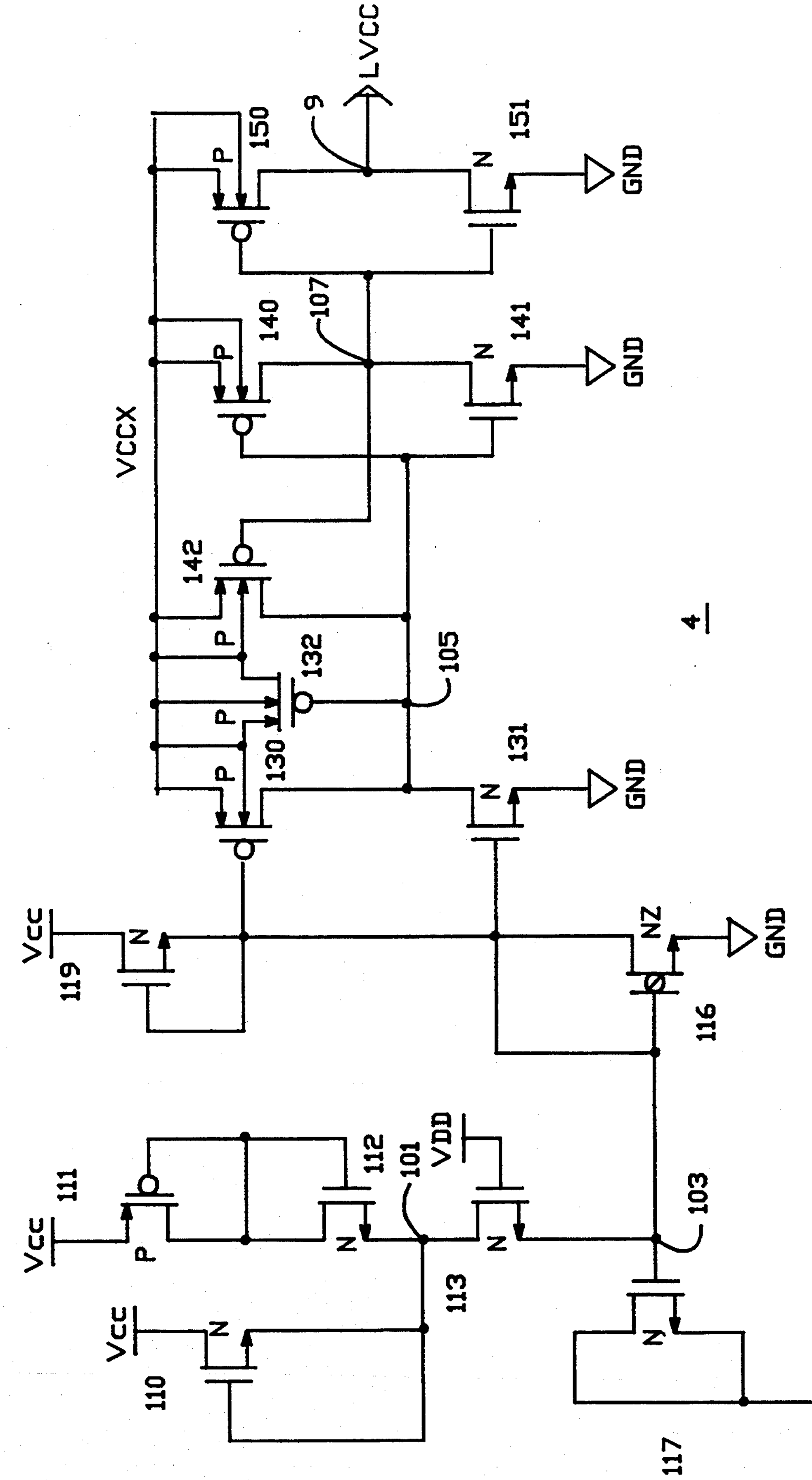

FIG. 5 a circuit diagram of the low Vcc detector.

Figure 6:
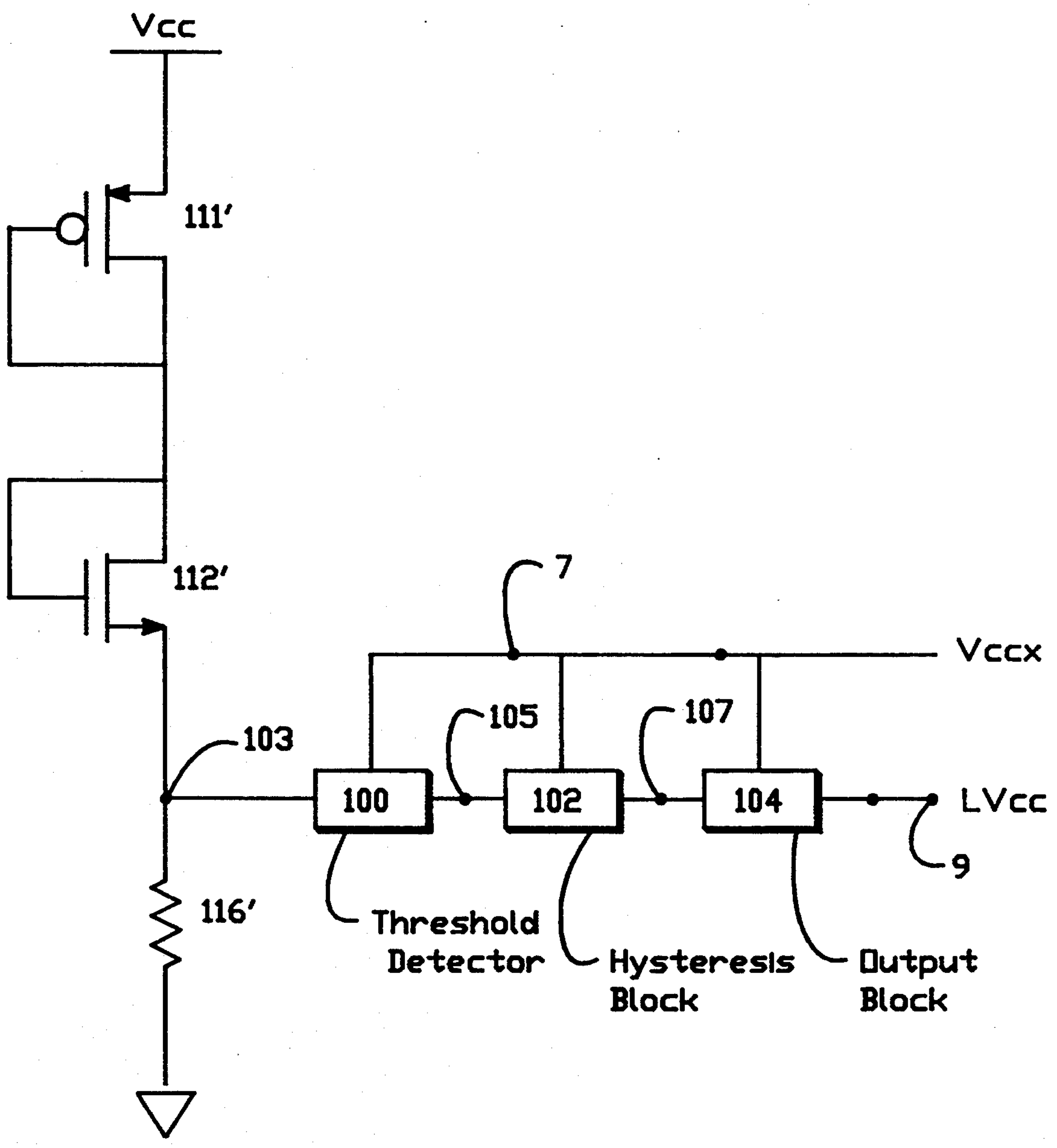

FIG. 6 a simplified circuit diagram of the low Vcc detector.

Figure 7:
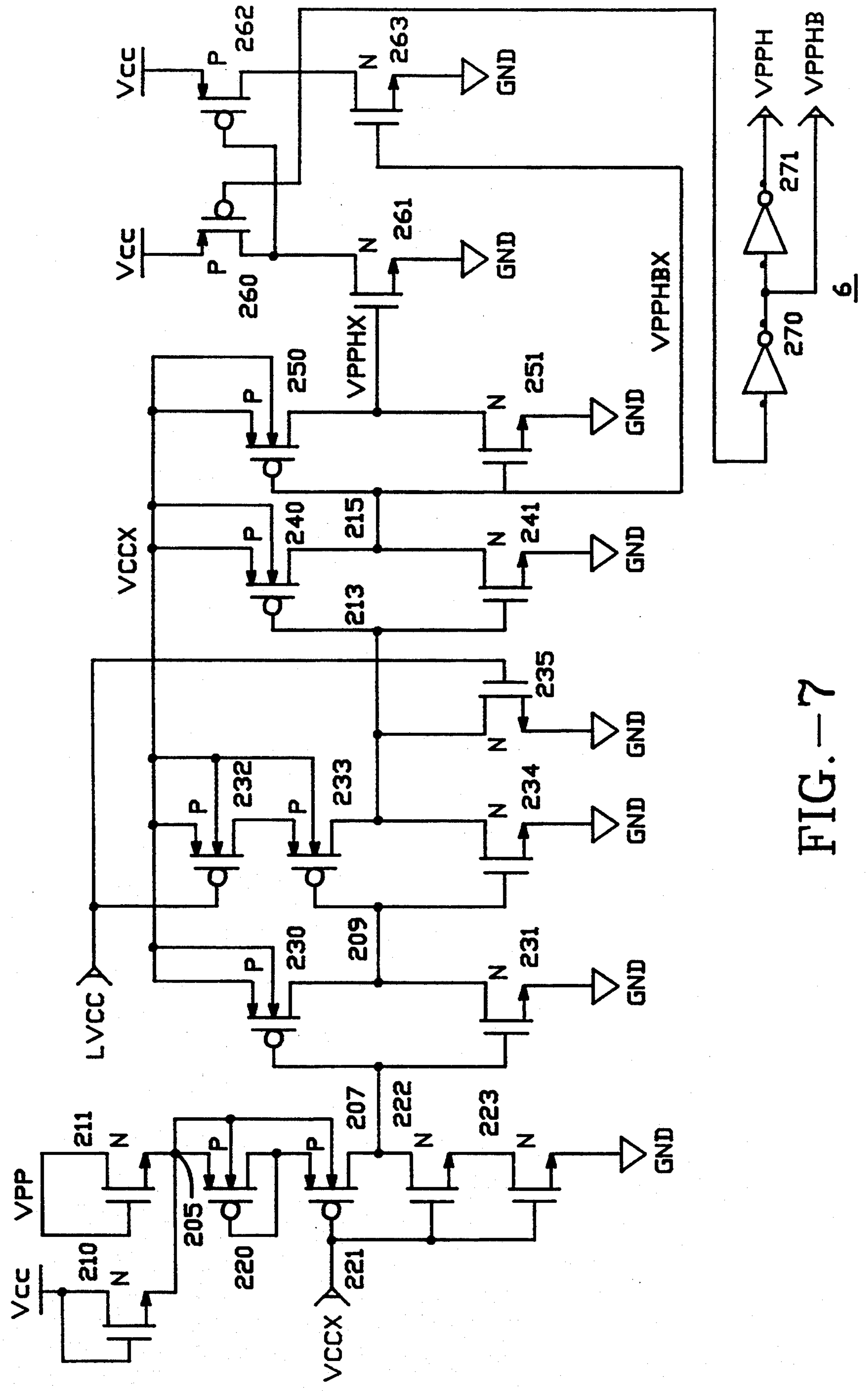

FIG. 7 is a circuit diagram of the high Vpp detector.

Figure 8:
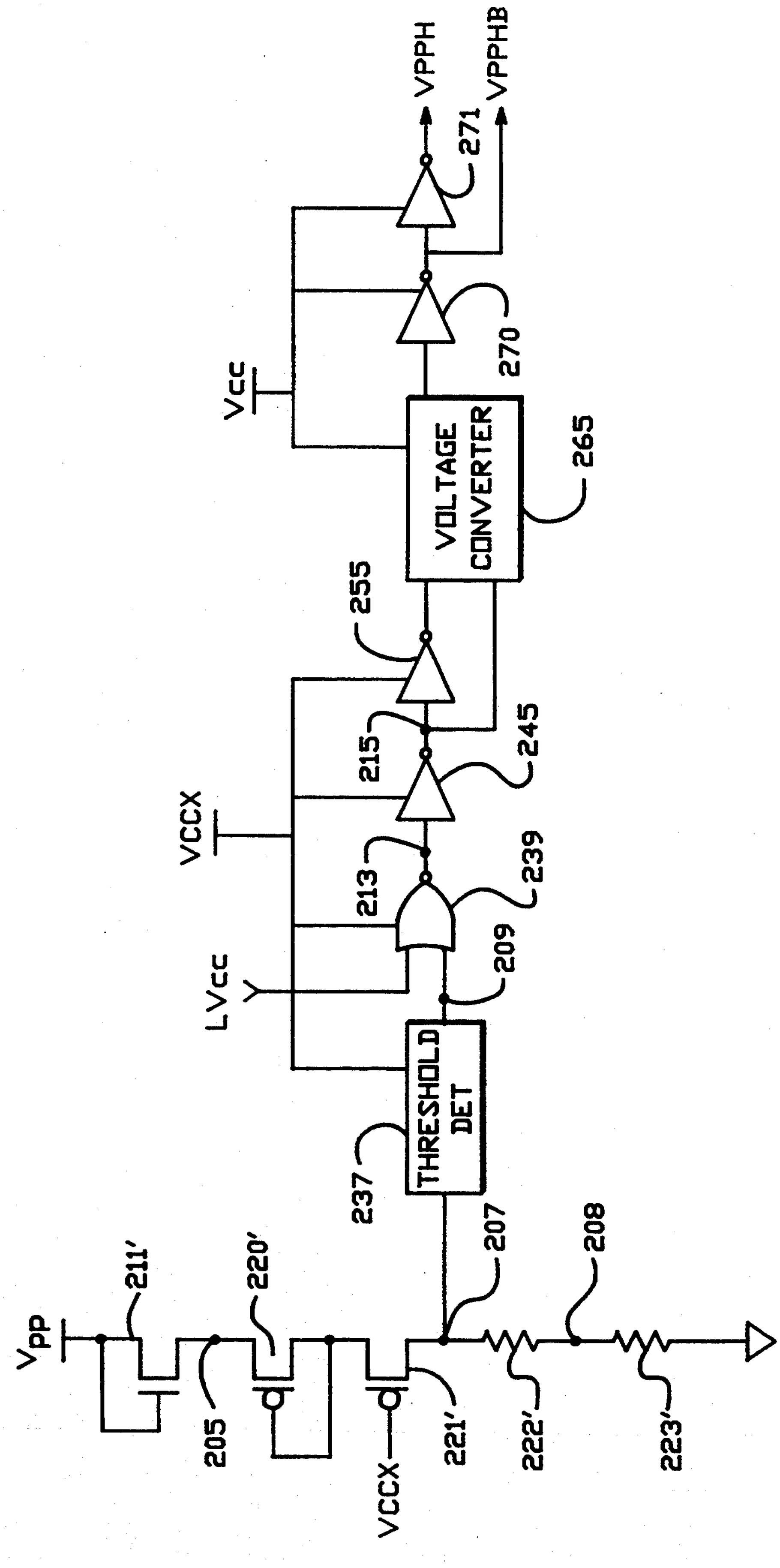

FIG. 8 is a simplified diagram of the high Vpp detector.

Figure 9:
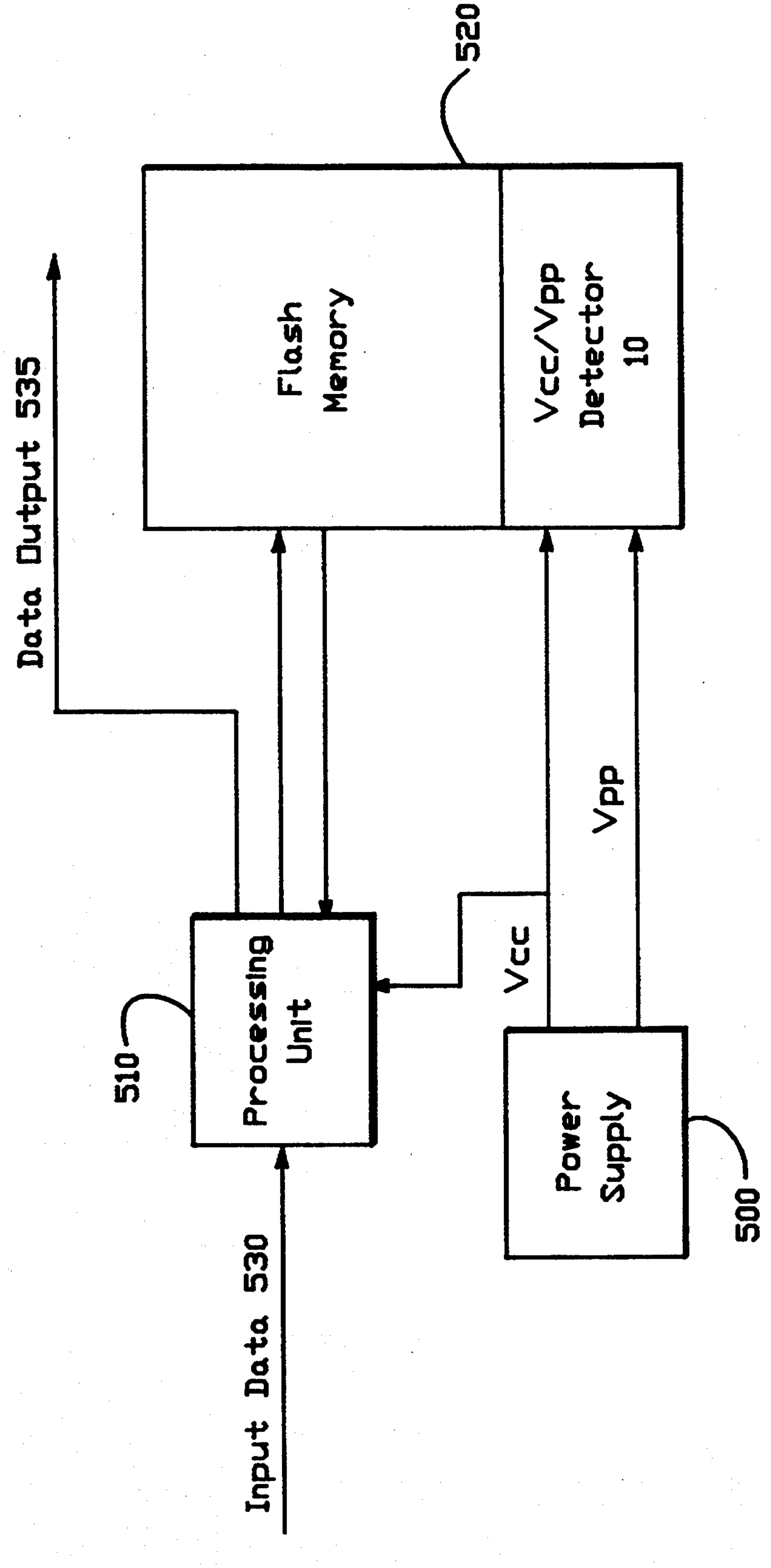

FIG. 9 a conceptual block diagram of a processing according the present invention.

Figure 10:
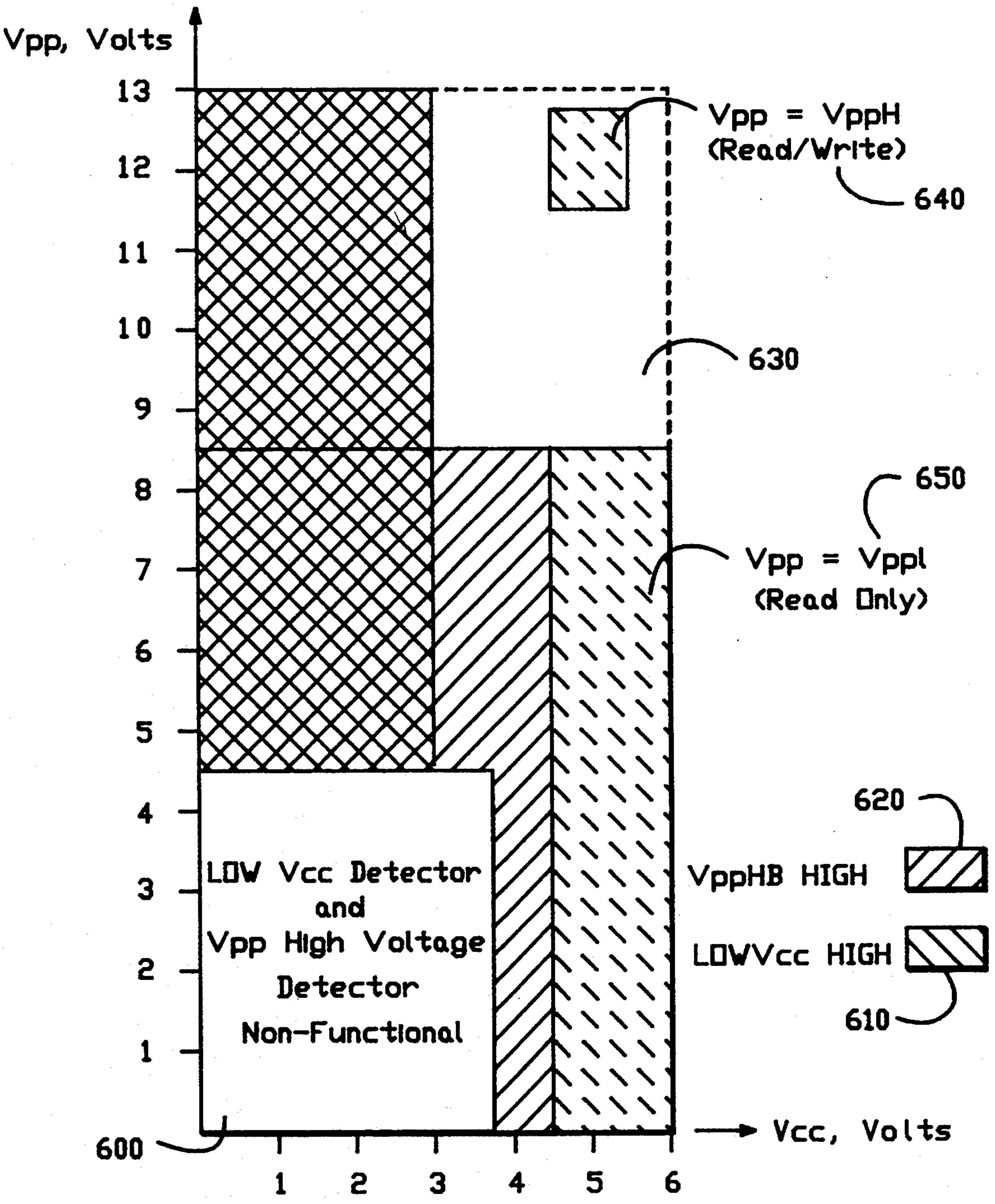
FIG.—10 (PRIOR ART)

FIG. 10 is a diagram illustrating the operating range of the Vcc/Vpp voltage detection circuit 10 for preventing the erasure and programming of a nonvolatile memory device used in a processing system.

DETAILED DESCRIPTION OF THE INVENTION

Figure 1:
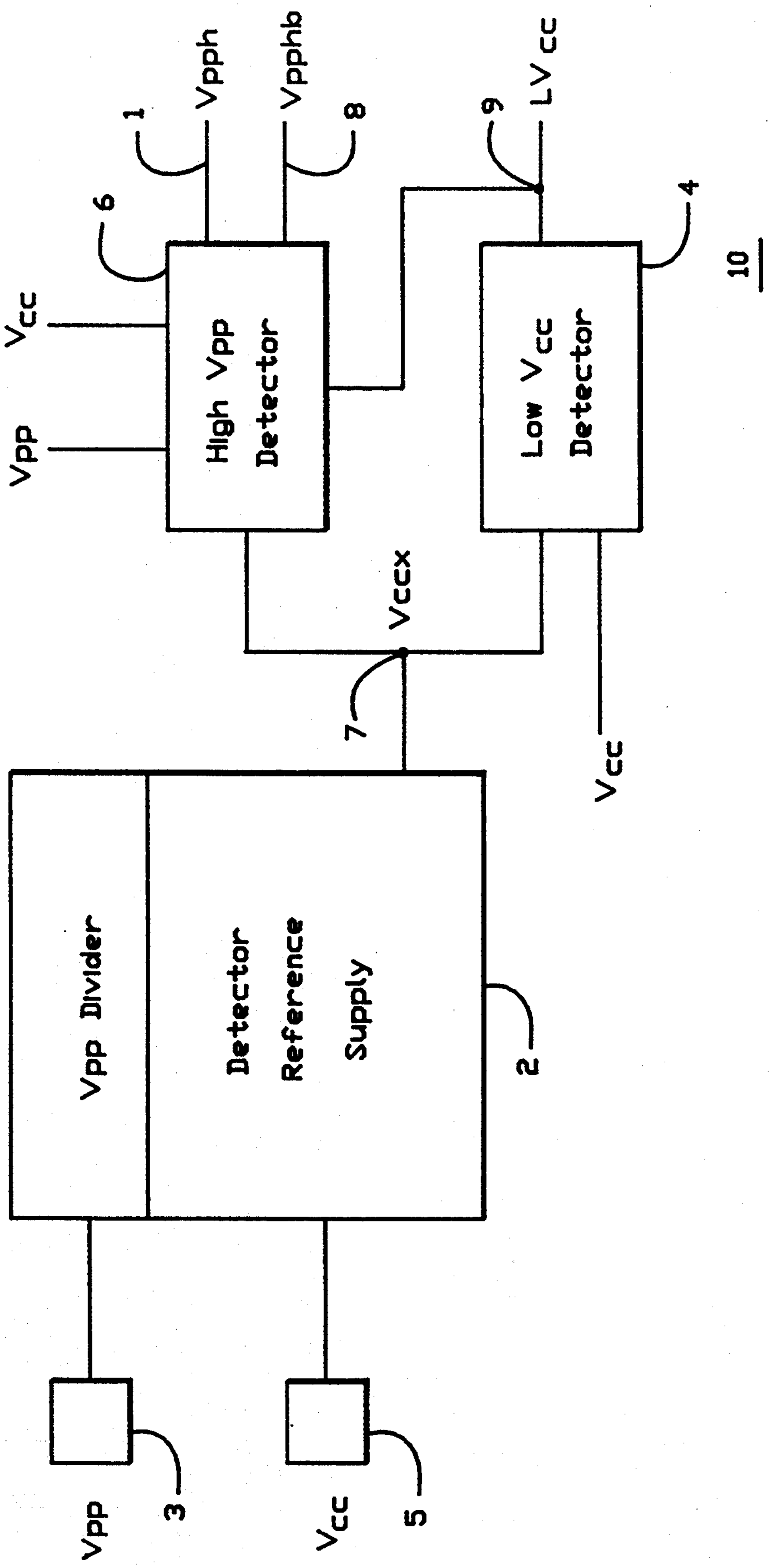
FIG. 1 is a block diagram of the Vcc/Vpp voltage detection circuit.

An overview of a preferred embodiment of a voltage detection circuit is illustrated in FIG. 1. FIG. 1 depicts Vcc/Vpp detection circuit 10. Detector reference supply 2 is coupled to Vcc at Vcc pad 5. Detector reference supply 2 includes a Vpp divider and is coupled to Vpp at Vpp pad 3. Detector reference supply 2 provides an output Vccx 7. Low Vcc detector 4 receives inputs from Vcc and Vccx 7 and provides an output LVcc 9. High Vpp detector 6 receives inputs from Vccx 7, Vpp, Vcc, and LVcc 9. The outputs of high Vpp detector 6 are Vpph 1 and Vpphb 8.

The Vcc/Vpp detection circuit 10 detects the occurrence of low voltage on either the Vpp or the Vcc supply voltage. Upon detection of low voltage, Vcc/Vpp detection circuit 10 provides a low Vpph 1 signal or a high LVcc 9 signal corresponding to the low voltage. Detector reference supply 2 supplies reference voltage Vccx 7 to low Vcc detector 4 and high Vpp detector 6. Low Vcc detector 4 is coupled to Vcc and is operative to determine whether Vcc is below a predetermined minimum voltage level. The minimum voltage level is set at the minimum voltage at which circuits can sustain proper operation. If the Vcc voltage applied to the low Vcc detector 4 is below the predetermined minimum voltage, low Vcc detector 4 causes signal LVcc 9 to a high logic level. This high logic level for LVcc 9 corresponds to a first not-ready signal. A logic low LVcc 9 corresponds to a first ready signal.

The high Vpp detector 6 detects when the Vpp input voltage is above or below a predetermined high threshold voltage level. High Vpp detector 6 causes Vpph 1 to a high logic level when the Vpp input is above the predetermined minimum voltage and LVcc is at logic low (Vcc is above a predetermined minimum voltage level). This logic high Vpph 1 corresponds to a second ready signal. A logic low Vpph 1 corresponds to a second not-ready signal. Output signal Vpphb 8 is the complement of Vpph 1.

LVcc 9 is coupled to high Vpp detector 6 and causes Vpph to be a low logic level even when Vpp is at a voltage level above the predetermined voltage. This feature is advantageous to prevent invalid 5 volt control signals from inadvertently altering the nonvolatile memory when Vpp is sufficiently high.

For example, some nonvolatile memory devices which include EPROMs, EEPROMs and flash memory devices can be reprogrammed when the memory receives an externally generated erasing/programming potential Vpp of approximately 12 volts. If the Vcc voltage is below the predetermined minimum, circuits powered by Vcc may operate in an unpredictable manner. To avoid the occurrence of inadvertent programming of the nonvolatile memory while control signals relying on Vcc are not guaranteed valid, high Vpp detector 6 receives signal LVcc 9 and is responsive to LVcc 9 to inhibit Vpph from asserting a high logic level when low Vcc detector 4 detects a low Vcc voltage.

Vcc/Vpp detection circuit 10 is fabricated using metal-oxide-semiconductor (MOS) processing. More specifically, complimentary metal-oxide-semiconductor (CMOS) technology is used to fabricate the transistor devices shown in the figures. N-type devices are formed in a p-substrate and p-type devices are formed in the n-wells, the n-wells being first formed in the p-substrate. NZ devices are also depicted in the figures. An NZ device is a n-channel device with a threshold voltage of approximately 0.0 volts.

Figure 2:
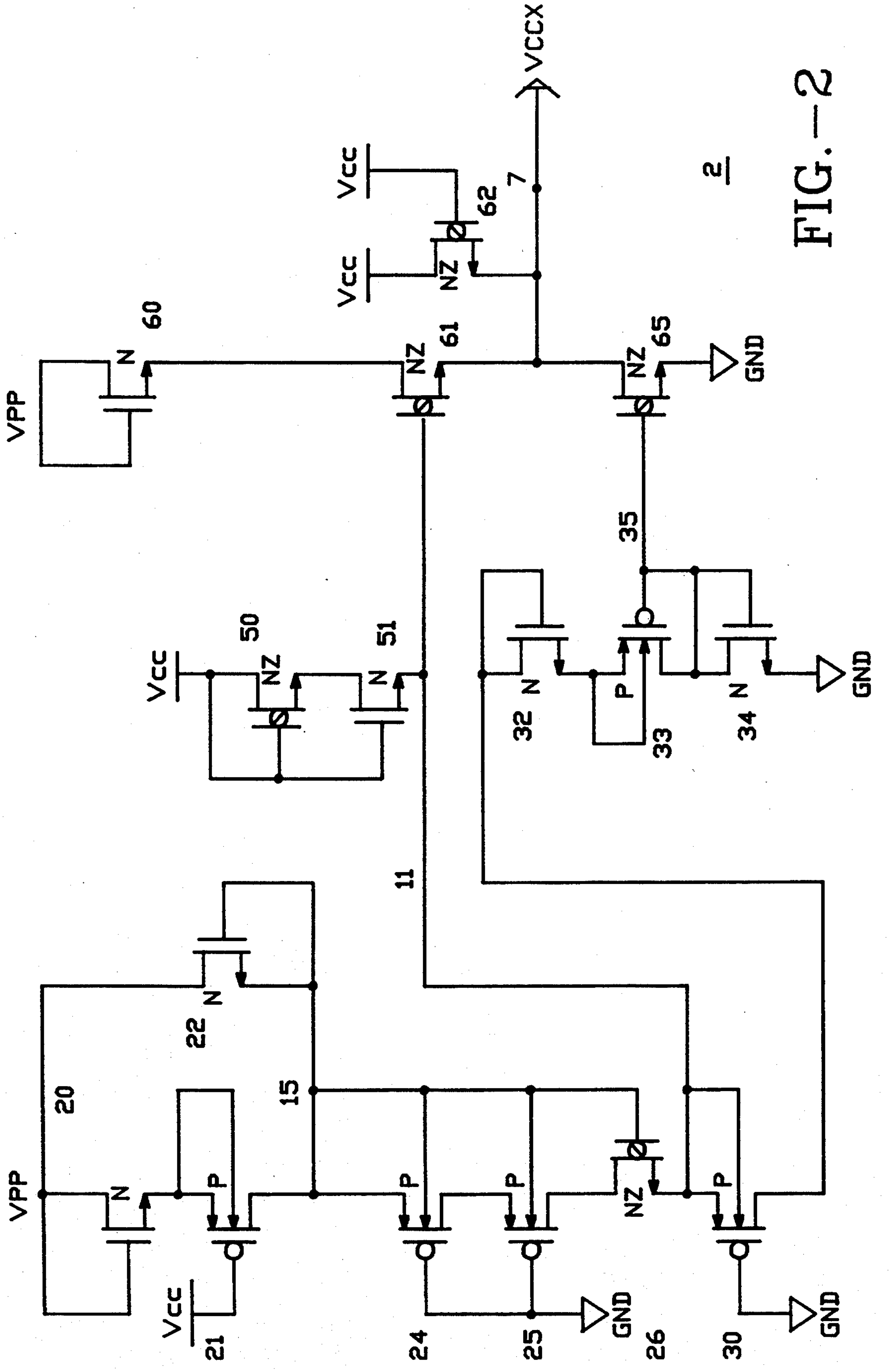
FIG. 2 is a circuit diagram of the detector power supply.

FIG. 2 is a circuit diagram of detector power supply 2. The operation of detector power supply 2 is explained with reference to FIG. 3.

Figure 3:
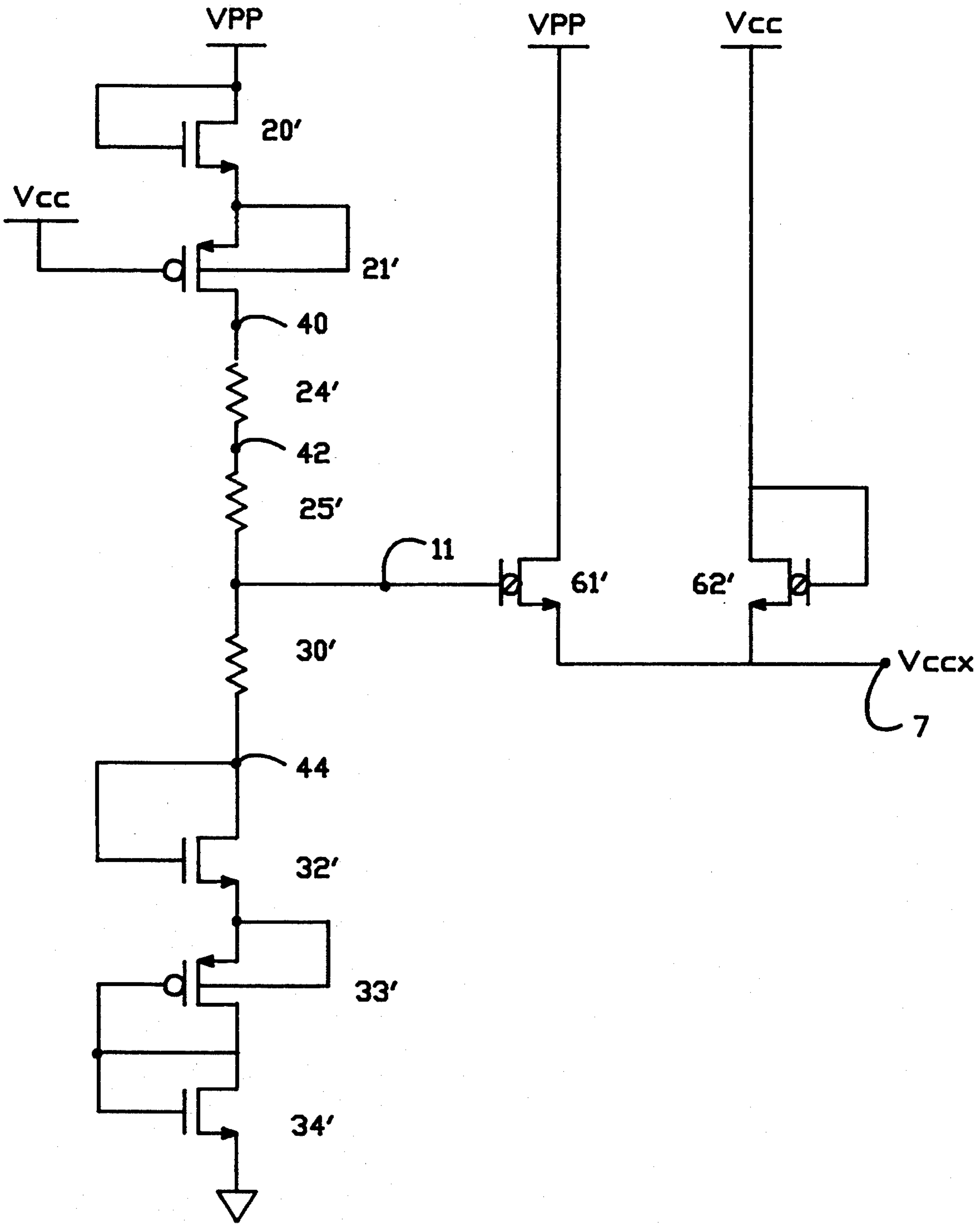
FIG. 3 is a simplified circuit diagram for the detector power supply.

FIG. 3 depicts a simplified circuit for detector power supply 2. Vpp is coupled to the drain and gate of n-channel device 20'. The source of n-channel device 20' is coupled to the source and substrate of p-channel device 21'. The gate of p-channel device 21' is coupled to Vcc, and the drain is coupled to node 40. Resistive device 24' is coupled between nodes 40 and 2. Resistive device 25' is coupled between nodes 42 and 11. Resistive device 30' is coupled between nodes 11 and 44. The drain and gate of n-channel device 32' are coupled to node 44, and the source of n-channel device 32' is coupled to the substrate and source of p-channel device 33'. The drain and gate of p-channel device 33' are coupled to the drain and gate of n-channel device 34'. The source of n-channel device 34' is coupled to ground. The drain of NZ device 61' is coupled to Vpp, and the gate is coupled to node 11. The drain and gate of NZ device 62' are coupled to Vcc. The sources of NZ devices 61' and 62' are coupled to output Vccx 7.

Vpp provides the input power for the output at node 11. Devices 20', 21', 32', 33' and 34' are configured to function as diode voltage drop elements. Devices 24', 25' and 30' are configured to function as resistive elements. Table I gives relative width and length dimensions in microns that correspond to devices depicted in the FIGS. 2, 5 and 7. Referring to Table I, the lengths of devices 24, 25 and 30 of FIG. 2 are ten times longer than the width. The devices operate in their linear region, functioning as a resistor. Node 11 is the output from the Vpp input.

TABLE I

| DEVICE # | WIDTH | LENGTH |
|---|---|---|
| 20 | 30 | 2 |
| 21 | 30 | 2 |
| 22 | 8 | 2 |
| 24 | 4 | 40 |
| 25 | 4 | 40 |
| 26 | 4 | 4 |
| 30 | 4 | 40 |
| 32 | 30 | 1.4 |
| 33 | 60 | 1.6 |
| 34 | 30 | 1.4 |
| 50 | 4 | 160 |
| 51 | 4 | 2 |
| 60 | 200 | 2 |
| 61 | 160 | 3 |
| 62 | 100 | 3 |
| 65 | 2 | 200 |
| 110 | 8 | 1.2 |
| 111 | 20 | 1.6 |
| 112 | 10 | 1.4 |
| 113 | 4 | 15 |
| 116 | 3.5 | 100 |
| 117 | 15 | 10 |
| 119 | 8 | 1.2 |
| 130 | 3 | 60 |
| 131 | 20 | 2 |
| 132 | 10 | 10 |
| 140 | 5 | 2 |

TABLE I-continued

| DEVICE # | WIDTH | LENGTH |
|---|---|---|
| 141 | 15 | 2 |
| 142 | 5 | 8 |
| 150 | 15 | 2 |
| 151 | 15 | 2 |
| 210 | 10 | 3 |
| 211 | 30 | 3 |
| 220 | 30 | 2 |
| 221 | 30 | 2 |
| 222 | 5 | 30 |
| 223 | 5 | 30 |
| 230 | 4 | 15 |
| 231 | 15 | 3 |
| 232 | 10 | 2 |
| 233 | 10 | 2 |
| 234 | 10 | 2 |
| 235 | 5 | 2 |
| 240 | 10 | 2 |
| 241 | 10 | 2 |
| 250 | 10 | 2 |
| 251 | 10 | 2 |
| 260 | 4 | 6 |
| 261 | 12 | 2 |
| 262 | 4 | 6 |
| 263 | 12 | 2 |

Figure 4:
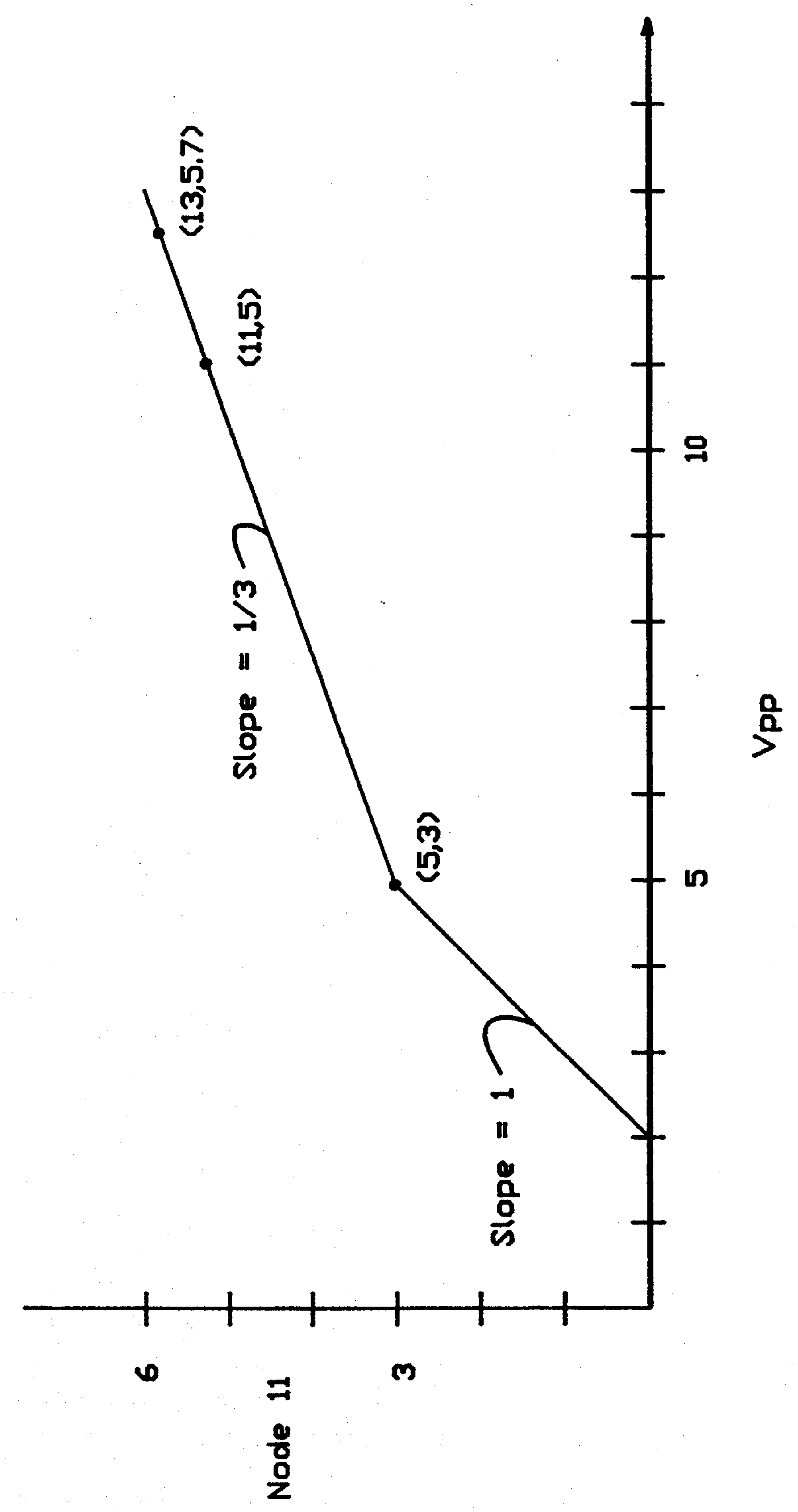
FIG. 4 is a graph of the voltage at node 11 versus Vpp.

FIG. 4 shows a graph of node 11 versus Vpp as Vpp goes from 0 volts to 13 volts, assuming Vcc is 0 volts. Vpp has to be greater than 2 volts before node 11 has a voltage. This is caused by diode devices 20' and 21'. The 2 volts drop corresponds to the 1 volt threshold voltage drop per MOS device. Thus, each diode device accounts for 1 volt drop. Once Vpp overcomes the 2 diodes drops of device 20' and device 21', voltage is detected at node 11. As Vpp increases, the voltage at node 11 increases in proportion with the increase. Devices 32', 33' and 34' acting as diodes prevent a voltage drop across resistive devices 24', 25' and 30'. Thus, until Vpp reaches 5 volts, diode devices 32', 33' and 34' cause the voltage at node 11 to correspond with the increase of Vpp.

As Vpp voltage increases above 5 volts, the resistive devices 24', 25' and 30' function as a voltage divider to reduce the voltage of node 11. As shown in Table I, devices 24, 25 and 26 of FIG. 2 are similarly configured having the same width and length. Thus, the voltage at node 11 is reduced by $\frac{2}{3}$. FIG. 4 graphically illustrates the voltage at node 11 as Vpp increases above 5 volts. For example, when Vpp is at 11 volts, node 11 is at 5 volts. Similarly, when Vpp is at 13 volts, node 11 is at 5.7 volts.

Referring to FIG. 3, device 61' and device 62' are configured to function as a wire-or. Device 62' is a NZ device coupled to Vcc and the output Vccx 7. Thus, NZ device 62' couples Vcc to Vccx 7. NZ device 61' is coupled to node 11 and the output Vccx 7. The greater of node 11 or Vcc is applied at the output Vccx 7 as the output supply power for detector power supply 2.

Referring to FIG. 2, devices 20, 21, 24, 25, 30, 32, 33, 34, 61 and 62 correspond to devices 20', 21', 24', 25', 30', 32', 33', 34', 61' and 62' of FIG. 3. The drains of n-channel devices 20 and 22 are coupled to Vpp. The gate of device 20 is also coupled to Vpp. The source and substrate of p-channel device 21 are coupled to the source of n-channel device 20 and the gate of p-channel device 21 is coupled to Vcc. N-channel device 22 is configured as a reverse diode to discharge noise 15 when Vpp is not active. Node 15 is the junction for the drain of p-channel device 21, the source and gate of n-channel device 22, the gate of NZ device 26, the source and substrate of p-channel device 24 and the substrate of p-channel device 25. The gates of p-channel device 24 and p-channel device 25 are coupled to ground. The drain of p-channel device 24 is coupled to the source of p-channel device 25. The drain of NZ device 26 is coupled to the drain of p-channel device 25, and the source of NZ device 26 is coupled to the source and substrate of p-channel device 30. The gate of p-channel device 30 is coupled to ground while the drain is coupled to the drain and gate of n-channel device 32. The source of n-channel device 32 is coupled to the source and substrate of p-channel device 33. Node 35 is the junction of the gate and drain of p-channel device 33 and the gate and drain of n-channel device 34 and the gate of NZ device 65. The source of n-channel device 34 is coupled to ground. NZ device 50 is configured like a diode with the gate and the drain coupled to Vcc. The source of NZ device 50 is coupled to the drain of n-channel device 51. The gate of n-channel device 51 is coupled to Vcc while the source of n-channel device 51 is coupled to node 11.

Devices 50 and 51, through Vcc, function to maintain node 11 so that the voltage on node 11 does not float. Since node 11 is primarily driven by Vpp, a low Vpp voltage can cause node 11 to float or have an indeterminate value. NZ device 50 and n-channel device 51 are configured to permit a small amount of current to flow to node 11. NZ device 50 has a length of 160 and a width of 4. The length is 40 times longer than the width of the device. Thus, device 50 is very resistive and very little current flows to node 11.

NZ device 26 is configured as a reverse diode to prevent Vcc current flowing from devices 50 and 51 and forward bias the drain junction of P-device 25 when Vpp is not active.

NZ device 62 provides the Vcc input to output Vccx 7. The drain and gate of device 62 are coupled to Vcc while the source is coupled to Vccx 7. Since device 62 is a NZ device, the output voltage of Vccx 7 is equal to Vcc. The source of NZ device 61 is also coupled to Vccx 7. The gate of NZ device 61 is coupled to node 11 while the drain is coupled to the source of n-channel device 60. The gate and drain of n-channel device 60 are coupled to Vpp. As mentioned above, NZ device 61 functions as a wire-or of node 11 or Vcc. The greater of the voltage at node 11 or at the source of NZ device 62 is supplied as the output for Vccx 7.

N-channel device 60 is added to reduce voltage stress on NZ device 61. The threshold voltage drop for device 60 is 1.5 volts. The drain of NZ device 65 is also coupled to Vccx 7. The gate is coupled to node 35 and the source is coupled to ground. NZ device 65 discharges the voltage at Vccx 7 when both Vpp and Vcc are at ground. Device 65 is configured to source very little current. As shown in Table I, the, length of device 65 is 100 times longer than the width. Thus, device 65 is very resistive, and very little current flows to ground.

FIG. 5 is a circuit diagram of low Vcc detector 4. Vccx 7 supplies the power for low Vcc detector 4. The output signal LVcc 9 is at a high logic level when Vcc is detected low and is at a low logic level when Vcc is detected above 3 volts.

FIG. 6 is a simplified diagram of Low Vcc detector 4. The source of p-channel device 111' is coupled to Vcc. The gate and drain of device 111' are coupled to the gate and drain of n-channel device 112'. The source of n-channel device 112' is coupled to node 103. Resistive device 116' is coupled between node 103 and ground.

The input of threshold detector 100 is coupled to node 103, and the output is coupled to node 105. The input of hysteresis block 102 is coupled node to 105, and the output is coupled to node 107. The input of output block 104 is coupled to node 107, and the output is coupled to LVcc 9. Threshold detector 100, hysteresis block 102, and output block 104 are coupled to Vccx 7.

Device 111′ and device 112′ function as diode voltage drop elements. Device 116′ is very resistive. Referring to Table I, the length of NZ device 116 of FIG. 5 is almost 30 times longer than the width. Vccx 7 supplies the power for threshold detector 100, hysteresis block 102, and output block 104. Threshold detector 100 is represented by p-channel device 130 and n-channel device 131 of FIG. 5. As shown in Table 1, the dimensions of p-channel device 130 differ with n-channel device 131. Threshold detector 100 sets the threshold voltage for low Vcc detector 4. Thus, the threshold voltage for low Vcc detector 4 can be varied according to the dimensions of the devices. The voltage drop across device 116′ is applied to detector 100. The trip voltage for detector 100 is set at 1.3 volts. Device 111′ and device 112′ functioning as diode elements reduce the Vcc input by 2 volts. Thus, whenever Vcc is below 3.3 volts, the output of LVcc 9 is a high logic level. Hysteresis block 102 is represented by p-channel devices 140, 142, and n-channel device 141 of FIG. 5. Output block 104 is represented by p-channel device 150 and n-channel device 151 of FIG. 5. Threshold detector 100, hysteresis block 102, and output block 104 are comprised of inverters using CMOS technology. Thus, low Vcc detector 4 dissipates very little power.

Referring to FIG. 5, devices 111, 112 and 116 correspond to devices 111′, 112′ and 116′ of FIG. 6. The source of p-channel device 111 is coupled to Vcc. The gate and drain of p-channel device 111 are coupled to the drain and gate of n-channel device 112. The drain of n-channel device 110 is coupled to Vcc. The source and gate of n-channel device 110 are coupled to node 101. N-channel device 110 is configured as a reversed biased diode to discharge node 101 when Vcc is not active.

The drain of n-channel device 113 is coupled to node 101 and to the source of n-channel device 112. The gate of n-channel device 113 is coupled to Vcc, and the source is coupled to node 103 and to the gate of n-channel device 117. The drain and source of n-channel device 117 are coupled to ground. Device 113 and device 117 are used for AC timing. The devices provide a RC time constant to slow the 0 to 5 volts transition of Vcc when Vcc rises to 5 volts too fast.

The drain of n-channel device 119 is coupled to Vcc, and the gate and source of n-channel device 119 are coupled to node 103. The gate and drain of NZ device 116 are coupled to node 103, and the source is coupled to ground. Device 116 is highly resistive. N-channel device 119 is configured as a reversed biased diode to discharge node 103 when Vcc is not active.

The source and substrate of p-channel device 130 are coupled to Vccx 7, and the gate is coupled to node 103. The drain of n-channel device 131 is coupled to the drain of p-channel device 130. The gate of n-channel device 131 is coupled to node 103, and the source is coupled to ground. Node 105 is coupled to the drains of device 130 and device 131 and to the gate of p-channel device 132. The source, drain and substrate of p-channel device 132 are coupled to Vccx 7. P-channel device 132 is configured like a capacitor for AC timing to slow the rise of node 105.

Node 105 is coupled to the gate of p-channel device 140 and the gate of n-channel device 141. The source and substrate of device 140 are coupled to Vccx 7, and the source of device 141 is coupled to ground. The drains of device 140 and device 141 are coupled to node 107, and node 107 is coupled to the gate of p-channel device 150 and the gate of n-channel device 151. The source and substrate of device 150 are coupled to Vccx, and the source of device 151 is coupled to ground. The drains of device 150 and device 151 provide the output for LVcc 9.

The gate of p-channel device 142 is coupled to node 107. The source and substrate of device 142 are coupled to Vccx 7, and the drain is coupled to node 105. P-channel device 142 provides a hysteresis effect on output LVcc 9. LVcc 9 becomes active at a different threshold voltage when Vcc is raised to 5 volts than when Vcc is reduced from 5 volts. When Vcc is low, node 105 is high, and node 107 is low which drives device 142 to a highly conducting state. As Vcc increases device 131 competes with both device 142 and device 130 to pull node 105 down, causing a higher trip voltage. As Vcc is reduced from a high state, node 107 begins high which reduces the conductivity of device 142. Thus, device 131 has less load from device 142, causing a lower trip voltage of about 3 volts. Hysteresis is provided, so that when Vcc drops, but remains higher than 3 volts, circuitry on the chip remains operational. P-channel device 142 reduces the trip voltage to less than 3 volts during a power down sequence as opposed to just above 3 volts during a power up sequence. Thus, as Vcc is reduced LVcc 9 becomes inactive at a lower Vcc voltage than when Vcc is increased from 0 volts.

FIG. 7 is a circuit diagram of high Vpp detector 6. The inputs to high Vpp detector 6 are Vccx 7, Vpp, Vcc and LVcc 9. Vccx 7 provides power for high Vpp detector 6. The outputs to high Vpp detector 6 are Vpph 1 and Vpphb 8. Vpphb 8 is the complement of output Vpph 1. Vpph 1 is low when Vpp does not exceed a predetermined high voltage level or when LVcc 9 is high.

FIG. 8 depicts a simplified diagram of high Vpp detector 6. Vpp is supplied through diode-connected n-channel transistor 211′ to node 205, and from node 205 through diode-connected p-channel transistor 220′ to the source of p-channel transistor 221′. The gate of p-channel device 221′ is coupled to Vccx, and the drain of p-channel device 221′ is coupled to node 207. Resistive device 222′ is coupled between node 207 and node 208. Resistive device 223′ is coupled between node 208 and ground. The input of threshold detector 237 is coupled to node 207, and the output is coupled to node 209. The inputs of NOR gate 239 are coupled to node 209 and LVcc, and the output is coupled to node 213. The input of inverter 245 is coupled to node 213, and the output is coupled to node 215 and an input voltage converter 265. The input of inverter 255 is coupled to node 215, and the output is coupled to a second input of voltage converter 265. Voltage converter 265 translates the signal level from Vccx powered circuits 237, 239,245, and 255, to normal Vcc levels for circuits 270 and 271 which are powered by Vcc. The output of voltage converter 265 is coupled to the input of inverter 270. The output of inverter 270 is Vpphb. The input of inverter 271 is coupled to Vpphb, and the output is Vpph.

Vccx provides an input to the gate of p-channel device 221′ to enable the high Vpp detector. P-channel device 221' is configured to turn on and allow current to flow when Vpp is approximately 3 volts higher than the input Vccx 7. The Vpp input to p-channel device 221' is reduced by 3 volts by diode devices 211' and 220' and the threshold voltage of p-channel device 221'. N-channel devices 222' and 223' are very resistive. As shown in Table I, the lengths of devices 222 and 223 of FIG. 7 are 6 times longer than the width.

P-channel device 230 and n-channel device 231 of FIG. 7 are depicted as threshold detector 237 in FIG. 8. P-channel devices 232 and 233 and n-channel devices 234 and 235 of FIG. 7 are depicted as nor gate 239 in FIG. 8. P-channel device 240 and n-channel device 241 of FIG. 7 are depicted as inverter 245 in FIG. 8. P-channel device 250 and n-channel 251 of FIG. 7 are depicted as inverter 255 in FIG. 8. P-channel devices 260 and 262 and n-channel devices 261 and 263 of FIG. 7 are depicted as voltage converter 265 in FIG. 8. Inverters 270 and 271 of FIG. 7 are also shown in FIG. 8. The use of CMOS devices in high Vpp detector 6 reduces power dissipation.

Referring to FIG. 8, when Vpp is 3 volts greater than Vccx, device 221' is on and current flows from Vcc to ground through resistive devices 222' and 223'. The current flow through resistive devices 222' and 223' provides the voltage to activate threshold detector 237. As shown in Table I, the dimensions of p-channel device 230 differ with n-channel device 231. Threshold detector 237 sets the threshold voltage for high Vpp detector 6. Thus, the threshold voltage for high Vpp detector 6 can be varied according to the dimensions of the devices. Resistive devices 222' and 223' and p-channel device 221' are configured to cause threshold detector 237 to a low logic level when Vpp exceeds the predetermined high voltage. The low logic level from the output of threshold detector 237 is applied to the input of nor gate 239. If LVcc input to nor gate 239 is low, the output of nor gate 239 will depend on the input from threshold detector 237. The low logic level from threshold detector 237 causes nor gate 239 to provide a high logic level. The output of inverter 245 will be a low logic level and the output of inverter 255 will be a high logic level. The high signal, after conversion from Vccx to Vcc level in converter 265, and supply to the input of inverter 270, causes the output of inverter 270 to be a low logic level, providing the signal Vpphb. After the signal flows through inverter 271, Vpph will be a high logic level. Thus, when Vpp is at least 3 volts higher than Vccx and LVcc is low, device 221' is on and Vpph will have a high logic level.

Referring to FIG. 7, devices 211, 220, 221, 222 and 223 correspond to devices 211', 220', 221', 222' and 223' of FIG. 8. The game and drain of n-channel device 211 are coupled to Vpp, and the source of n-channel device 211 is coupled to the source of n-channel device 210, the source and substrate of p-channel device 220, and the substrate of p-channel device 221. The gate and drain of n-channel device 210 are coupled to Vcc. Device 210 supplies voltage to node 205 to prevent the node from floating when Vpp is not active. The drain and game of p-channel device 220 are coupled to the source of p-channel device 221. Vccx 7 is coupled to the gates of p-channel device 221, n-channel device 222 and n-channel device 223. The drain of device 221 is coupled to the drain of device 222, and the source of device 222 is coupled to the drain of device 223. The source of device 223 is coupled to ground. Devices 211 and 220–223 are configured to supply a trip voltage at node 207.

The trip voltage provides the input to threshold detector 237. Threshold detector 237 is an inverter comprised of p-channel device 230 and n-channel device 231. The source and substrate of p-channel device 230 are coupled to Vccx 7, and the drain is coupled to the drain of n-channel device 231. The input of the inverter is coupled to node 207 which is coupled to the gate of p-channel device 230 and the gate of n-channel device 231. The source of n-channel device 231 is coupled to ground.

Node 209 is the output of threshold detector 237 and is coupled to the gate of p-channel device 233 and the gate of n-channel device 234. Node 209 provides the first input to nor gate 239. The drains of n-channel device 234, n-channel device 235, and p-channel device 233 are coupled together at node 213. The source of n-channel device 235 is coupled to ground, and the gate is coupled to LVcc and the gate of p-channel device 232. LVcc provides the second input to nor gate 239. The source of n-channel device 234 is coupled to ground while the source and substrate of p-channel device 232 and the substrate of p-channel device 233 are coupled to Vccx. The drain of p-channel device 232 is coupled to the source of p-channel device 233. The output of nor gate 239 is node 213.

Node 213 provides the input to inverter 245 at the gates of p-channel device 240 and n-channel device 241. The drains of p-channel device 240 and n-channel device 241 are coupled together and form the output of inverter 245 at node 215. The source and substrate of p-channel device 240 are coupled to Vccx while the source of n-channel device 241 is coupled to ground.

Node 215 provides the input to the gate of p-channel device 250 and the gate of n-channel device 251. Node 215 is also Vpphbx which is an input to converter 265. The drain of p-channel device 250 is coupled to the drain of n-channel device 251 and provides the output Vpphx. The source and substrate of p-channel device 250 are coupled to Vccx while the source of n-channel device 251 is coupled to ground.

Vpphx is coupled to the gate of n-channel device 261 while Vpphbx is coupled to the gate of n-channel device 263. The drain of p-channel device 260 is coupled to the drain of n-channel device 261 while the drain of p-channel device 262 is coupled to the drain of n-channel device 263. The gate of p-channel device 260 is coupled to the drain of p-channel device 262 while the gate of p-channel device 262 is coupled to the drain of p-channel device 260. The sources of p-channel devices 260 and 262 are coupled to Vcc while the sources of n-channel devices 261 and 263 are coupled to ground. Voltage converter 265 comprising devices 260–263 prevents DC current while converting from Vccx to Vcc levels.

The input of inverter 270 is coupled to the drain of p-channel device 262 while the output of inverter 270 provides the output signal Vpphb and provides the input to inverter 271. Whenever Vpp is less than 8.7 volts, Vpph is a low logic level, and Vpphb is a high logic level. The threshold voltage for high Vpp detector 6 is 8.7 volts assuming Vcc is 5 volts. Thus, as Vpp exceeds 8.7 volts with Vcc at 5 volts, Vpph transitions to a high logic level and Vpphb to a low logic level. The output of inverter 271 is Vpph. Inverters 270 and 271 are used to increase the output drive capability of high Vpp detector 6. The outputs of the inverters 270 and 271 are routed to control state machines and high voltage program and erase circuitry to disable write operations when the power supply levels are invalid.

FIG. 9 depicts a system embodiment for Vcc/Vpp detection circuit 10. A processing unit 510 processes input data 530 and accesses memory 520 for program instructions and data. Data output 535 is provided by processing unit 510.

Memory 520 can be programmed or erased by the application of Vpp and Vcc. Vcc powers the logic for reading program instructions and data from memory 520. Thus, power supply 500 supplies Vcc power to processing unit 510 and to memory 520. Power supply 500 also supplies Vpp to memory 520 for programming operations.

On chip Vcc/Vpp detection circuit 10 of memory 520 is coupled to the Vcc output and the Vpp output of power supply 500. Vcc/Vpp detection circuit 10 prevents voltage from Vpp or Vcc from reprogramming or erasing memory 520 during power up sequences, power down sequences, or situations where the supply power is at a reduced capacity. Memory 520 contains state machines (not shown) to receive control signals from a host processor and the signals from Vcc/Vpp detection circuit 10 to control programming or erasing operations of memory 520. For example, if Vcc/Vpp detection circuit 10 detects a low voltage from Vcc and a high voltage from Vpp, signals from Vcc/Vpp detection circuit 10 will inhibit the programming or erasing mode of memory 520 to prevent inadvertent corruption of the data stored even if a correct command sequence is issued from the host. The state machines may cause memory 520 to be in a read only mode until sufficient Vcc power from power supply 500 is supplied to memory 520.

FIG. 10 is a diagram illustrating the operating range of Vcc/Vpp detection circuit 10 for preventing erasure of programming used in the preferred embodiment of the present invention adapted from U.S. Pat. No. 4,975,883. The X axis of the diagram in FIG. 10 corresponds to the reading voltage Vcc and the Y axis corresponds to the programming voltage Vpp. Region 600 represents the area where both Vcc and Vpp are sufficiently low that corruption of nonvolatile data cannot occur. This region provides voltages that are too low for most circuits to operate. Even Vcc/Vpp detection circuit 10 does not function. Region 610 represents the area where Vcc is low and the signal LVcc 9 is provided to prevent corruption of the nonvolatile data. Region 620 represents the area where Vpp is low, and the signal Vpph is a low logic level to prevent corruption of the nonvolatile data.

Region 650 represents the area where Vpp is low while Vcc is at the proper operating voltage. Thus, memory 520 can be placed in a read only mode. Region 630 is the area where a user must assure that no spurious writes occur to memory 520. The voltages are sufficient to properly control and operate memory 520. Region 640 is the valid operating range for updating the contents of memory 520.

As shown in FIG. 10, any power up or power down sequence is not possible without passing through the protected regions designated by region 610 and region 620. Thus, the present invention affords nonvolatile memory devices greater protection against spurious system level signals during the power up and power down transitions.

While the present invention has been particularly described with references to FIGS. 1–10, and with emphasis on integrated circuits, it should be understood that the figures are for illustration only and should not be taken as limitations on the invention. In addition, it is clear that the method and apparatus of the present invention have utility in many applications where protection against spurious system level signals during power up and power down transitions of a nonvolatile memory device as required. It is contemplated that many changes and modifications may be made by one of ordinary skill in the art without departing from the spirit and scope of the invention as disclosed.

We claim:

1. A voltage detection circuit for monitoring power supply voltages during power up and power down sequences, comprising:

a high voltage input to receive a high supply voltage for use in high voltage operations;

a low voltage input to receive a low supply voltage for use in low voltage operations and high voltage operations;

a reference circuit, coupled to the high voltage input and the low voltage input, which provides a reference voltage in response to the high voltage input and the low voltage input;

a low voltage detector, coupled to the low voltage input and the reference voltage, and providing a low voltage detector output, the low voltage detector having circuitry to provide a first not-ready signal at the low voltage detector output when a voltage on the low voltage input falls below a predetermined low voltage threshold and a first ready signal at the low voltage detector output when the voltage on the low voltage input is above a predetermined low voltage threshold; and a high voltage detector, coupled to the high voltage input, the reference voltage, and the low voltage detector output, and providing a high voltage detector output, the high voltage detector having circuitry to provide a second ready signal at the high voltage detector output in response to the first ready signal and a voltage on the high voltage input which is above a predetermined high voltage threshold, and a second not-ready signal at the high voltage detector output otherwise, so that the second ready signal is not asserted unless both the high supply voltage and the low supply voltage exceed the respective predetermined high voltage threshold and the predetermined low voltage threshold, respectively.

2. The voltage detection circuit of claim 1, wherein the high voltage detector includes a gate circuit responsive to the reference voltage to enable the circuitry to provide the second not-ready signal.

3. The voltage detection circuit of claim 1, wherein the reference circuit comprises:

a node voltage circuit coupled to the high voltage input, the node voltage circuit having an output node to reduce the high supply voltage to a node voltage for the output node; and a selector circuit that supplies the reference voltage as a function of the greater of the node voltage or the low supply voltage.

4. The voltage detection circuit of claim 3, wherein the node voltage circuit includes active devices.

5. The voltage detection circuit of claim 1, wherein the low voltage detector includes a threshold inverter having a trip voltage set to the predetermined low voltage threshold.

6. The voltage detection circuit of claim 5, wherein the threshold inverter of the low voltage detector includes a transistor device having a channel with a length and a width to set the trip voltage for the threshold inverter of the low voltage detector.

7. The voltage detection circuit of claim 5, wherein the low voltage detector includes a hysteresis circuit, coupled to the threshold inverter, to provide a first predetermined voltage threshold when the low voltage input exceeds the first voltage threshold and a second predetermined voltage threshold when the low voltage input falls below the second voltage threshold.

8. The voltage detection circuit of claim 7, wherein the low voltage detector includes an output buffer, coupled to the hysteresis circuit, to provide the first not-ready signal.

9. The voltage detection circuit of claim 1, wherein the high voltage detector includes a threshold inverter having a trip voltage set to the predetermined high voltage threshold.

10. The voltage detection circuit of claim 9, wherein the threshold inverter of the high voltage detector includes a transistor device having a channel with a length and a width to set the trip voltage for the threshold inverter of the high voltage detector.

11. The voltage detection circuit of claim 9, wherein the high voltage detector includes threshold logic, coupled to the threshold inverter and the first not-ready signal, to provide a threshold signal in response to the threshold inverter and the first not-ready signal.

12. The voltage detection circuit of claim 11, wherein the high voltage detector includes an output buffer responsive to the threshold signal to provide the second not-ready signal.

13. A voltage detector for monitoring power supply voltages during power up and power down sequences, comprising:

a reference circuit having a first voltage on a first input and a second voltage on a second input and circuitry to reduce the second voltage to a node voltage and to supply a reference voltage in response to a greater one of the first voltage or the node voltage;

a first voltage detection circuit powered by the reference voltage and responsive to the first voltage to provide a first when the first voltage is below a first predetermined voltage; and a second voltage detection circuit powered by the reference voltage and responsive to the second voltage and the first signal to provide a second signal.

14. The voltage detector of claim 13, wherein the circuitry implements a voltage divider to reduce the second voltage to the node voltage.

15. The voltage detector of claim 14, wherein the voltage divider comprises MOS devices.

16. The voltage detector of claim 13, wherein the first voltage detection circuit includes a threshold detector set at the first predetermined voltage to provide the first signal when the first voltage is below the first predetermined voltage.

17. The voltage detector of claim 16, wherein the first voltage detection circuit includes a hysteresis circuit, coupled to the threshold detector, to provide the first signal at a third predetermined voltage when the first voltage falls below the third predetermined voltage.

18. The voltage detector of claim 13, wherein the second voltage detection circuit has a first input, coupled to the first signal of the first voltage detection circuit, and a second input, coupled to the second voltage, and is responsive to the first signal and the second voltage to provide the second signal.

19. The voltage detector of claim 18, wherein the second voltage detection circuit includes:

a diode device, coupled to the second voltage, to reduce the second voltage to a third voltage;

a control circuit, coupled to the third voltage and the reference voltage, to provide an input voltage when the third voltage is greater than the reference voltage; and a threshold circuit, coupled to the control circuit, responsive to the input voltage to provide a threshold signal.

20. The voltage detector of claim 19, wherein the second voltage detection circuit includes an output converter, coupled to the threshold circuit, responsive to the threshold signal and the first signal to provide the second signal.

21. A processing system comprising:

a power supply to generate a first output for programming voltage and a second output for read voltage;

a reference supply, coupled to the first output and the second output, which provides a reference voltage in response to a greater one of the programming voltage or the read voltage;

a first voltage detector powered by the reference voltage and responsive to the read voltage to provide a first signal when the read voltage falls below a first predetermined voltage threshold;

a second voltage detector powered by the reference voltage and responsive to the programming voltage and the first signal, the second voltage detector providing a second signal in response to either the first signal or the programming voltage falling below a second predetermined voltage threshold;

a memory, coupled to the power supply, the first voltage detector, and the second voltage detector, which stores data and program instructions and has circuitry responsive to the first and second signals to control access of the memory so that memory cannot be altered when either the second voltage detector detects the first signal or the programming voltage falls below the second predetermined voltage threshold; and a processing unit, coupled to the power supply and to the memory, which accesses data and program instructions in the memory to process the data and the program instructions.

22. The processing system of claim 21, wherein the reference supply includes a voltage reduction circuit, coupled to the programming voltage of the power supply, which provides an intermediate voltage in response to the programing voltage.

23. The processing system of claim 22, wherein the reference supply provides the reference voltage in response to a greater one of the intermediate voltage or the read voltage.

24. The processing system of claim 21, wherein the memory includes a nonvolatile memory that can be erased and programmed when the programing voltage is provided to the memory.

25. The processing system of claim 24, wherein the nonvolatile memory can be placed into a read only mode in response to the first signal.

26. The processing system of claim 24, wherein the second signal disables erase and programming functions to the memory.

27. An integrated circuit memory device comprising:

a memory having a plurality of programmable storage locations; a low voltage input to receive a control supply voltage;

a high voltage input to receive a programming supply voltage;

a reference circuit, coupled to the high voltage input and the low voltage input, having a divider circuit to reduce the programming supply voltage to a node voltage and to supply a reference voltage at a reference circuit output in response to a greater one of the control voltage or the node voltage;

a control supply voltage detection circuit, coupled to the reference circuit output, and providing a control supply output, the control supply voltage detection circuit responsive to the control supply voltage to provide a control supply signal at the control supply output which indicates whether the control supply voltage is above or below a predetermined minimum control supply voltage; and a programming supply voltage detection circuit, coupled to the reference circuit output and the control supply output, and providing a programming supply output, the programming supply voltage detection circuit responsive to the programming supply voltage and the control supply signal to provide a programming supply signal at the programming supply output with one indication when the programming supply voltage is above a predetermined minimum programming supply voltage and the control supply voltage is above the predetermined minimum control supply voltage, and another indication otherwise.

28. The integrated circuit memory device of claim 27, wherein the divider circuit includes active devices to reduce the programming supply voltage to the node voltage.

29. The integrated circuit memory device of claim 27, wherein the programming supply voltage detection circuit includes a gate circuit responsive to the reference voltage to enable the programming supply voltage detection circuit when the reference voltage falls within a predetermined range below the programming supply voltage.

30. The integrated circuit memory device of claim 27, wherein the control supply voltage detection circuit includes a threshold detector having a voltage threshold set at the predetermined minimum control supply voltage to provide a threshold output.

31. The integrated circuit memory device of claim 30, wherein the threshold detector includes an inverter having a trip voltage set at the voltage threshold.

32. The integrated circuit memory device of claim 31, wherein the inverter includes a p-channel device and a n-channel device having a channel with a length and a width set to the trip voltage.

33. The integrated circuit memory device of claim 30, wherein the control supply voltage detection circuit includes hysteresis circuitry to provide a first minimum control supply voltage threshold during a rising supply voltage sequence and a second minimum control supply voltage threshold during a falling supply sequence.

34. The integrated circuit memory device of claim 33, wherein the control supply voltage detection circuit includes an output circuitry, coupled to the hysteresis circuitry to provide the low control supply signal.

35. The integrated circuit memory device of claim 27, wherein the programming supply voltage detection circuit includes circuitry having active devices to reduce the programming supply voltage to a reduced voltage and to provide a detection voltage when the reduced voltage is greater than the reference voltage.

36. The integrated circuit memory device of claim 35, wherein the programming supply voltage detection circuit includes a threshold detector having a voltage threshold set at the predetermined minimum programming supply voltage to provide a threshold output in response to the detector voltage.

37. The integrated circuit memory device of claim 36, wherein the threshold detector includes an inverter having the voltage threshold set at the predetermined minimum programming supply voltage.

38. The integrated circuit memory device of claim 36, wherein the programming supply voltage detection circuit includes logic which receives inputs from the low control supply signal of the control supply voltage detection circuit and the threshold signal to provide a logic signal.

39. The integrated circuit memory device of claim 38, wherein the programming voltage detection circuit includes an output buffer coupled to the logic responsive to the logic signal to provide the low programming signal.

* * * * *